US011315940B2

(12) United States Patent
Wang et al.

(10) Patent No.: US 11,315,940 B2
(45) Date of Patent: Apr. 26, 2022

(54) METHOD OF FORMING A DEVICE WITH PLANAR SPLIT GATE NON-VOLATILE MEMORY CELLS, HIGH VOLTAGE DEVICES AND FINFET LOGIC DEVICES

(71) Applicant: Silicon Storage Technology, Inc., San Jose, CA (US)

(72) Inventors: Chunming Wang, Shanghai (CN); Guo Xiang Song, Shanghai (CN); Leo Xing, Shanghai (CN); Jack Sun, Shanghai (CN); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 17/151,944

(22) Filed: Jan. 19, 2021

(65) Prior Publication Data

US 2022/0093623 A1    Mar. 24, 2022

(30) Foreign Application Priority Data

Sep. 21, 2020    (CN) .......................... 202010993707.2

(51) Int. Cl.
| | |
|---|---|
| *H01L 27/11531* | (2017.01) |
| *H01L 27/11521* | (2017.01) |
| *H01L 29/78* | (2006.01) |
| *H01L 21/762* | (2006.01) |
| *H01L 29/423* | (2006.01) |

(Continued)

(52) U.S. Cl.
CPC .. *H01L 27/11531* (2013.01); *H01L 21/26513* (2013.01); *H01L 21/76224* (2013.01); *H01L 27/11521* (2013.01); *H01L 29/40114* (2019.08); *H01L 29/42328* (2013.01);
(Continued)

(58) Field of Classification Search
None
See application file for complete search history.

(56) References Cited

U.S. PATENT DOCUMENTS

| | | |
|---|---|---|
| 7,927,994 B1 | 4/2011 | Liu et al. |
| 9,972,630 B2 | 5/2018 | Su et al. |

(Continued)

OTHER PUBLICATIONS

U.S. Appl. No. 16/724,010, filed Dec. 20, 2019, Jourba, et al., "Method of Forming a Device With Split Gate Non-volatile Memory Cells, HV Devices Having Planar Channel Regions and FINFET Logic Devices."

*Primary Examiner* — Xiaoming Liu
(74) *Attorney, Agent, or Firm* — DLA Piper LLP (US)

(57) ABSTRACT

A method of forming memory cells, HV devices and logic devices on a substrate, including recessing the upper surface of the memory cell and HV device areas of the substrate, forming a polysilicon layer in the memory cell and HV device areas, forming first trenches through the first polysilicon layer and into the silicon substrate in the memory cell and HV device areas, filling the first trenches with insulation material, forming second trenches into the substrate in the logic device area to form upwardly extending fins, removing portions of the polysilicon layer in the memory cell area to form floating gates, forming erase and word line gates in the memory cell area, HV gates in the HV device area, and dummy gates in the logic device area from a second polysilicon layer, and replacing the dummy gates with metal gates that wrap around the fins.

10 Claims, 10 Drawing Sheets

(51) Int. Cl.
*H01L 29/66* (2006.01)
*H01L 21/28* (2006.01)
*H01L 21/265* (2006.01)
*H01L 29/788* (2006.01)

(52) U.S. Cl.
CPC .. *H01L 29/66795* (2013.01); *H01L 29/66825* (2013.01); *H01L 29/7851* (2013.01); *H01L 29/7883* (2013.01)

(56) References Cited

U.S. PATENT DOCUMENTS

| | | |
|---|---|---|
| 9,985,042 B2 | 5/2018 | Su et al. |
| 10,312,247 B1 | 6/2019 | Jourba et al. |
| 2018/0012898 A1* | 1/2018 | Wu .................... H01L 29/42328 |
| 2019/0172942 A1 | 6/2019 | Yang et al. |
| 2020/0013788 A1* | 1/2020 | Jourba .............. H01L 29/66795 |
| 2020/0176459 A1 | 6/2020 | Zhou et al. |
| 2021/0013220 A1* | 1/2021 | Lin .................... H01L 29/66825 |

* cited by examiner

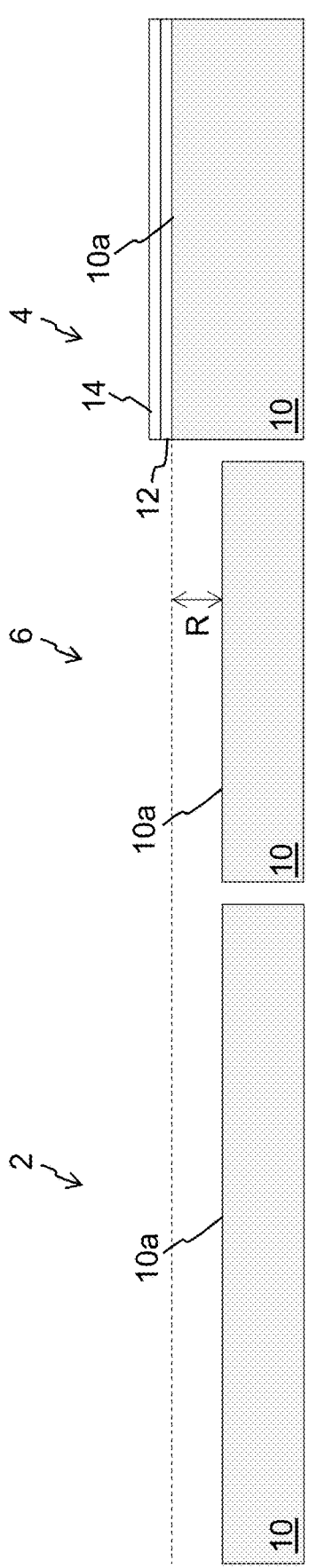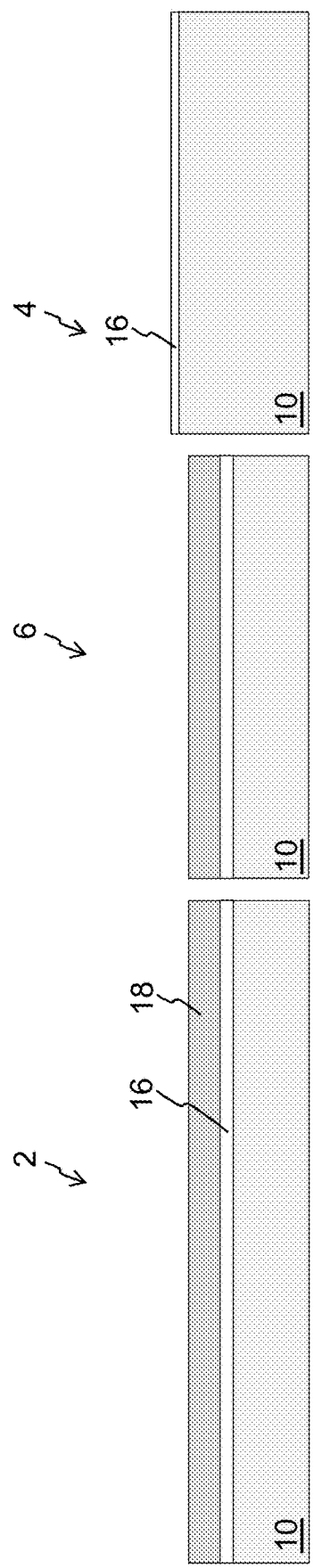

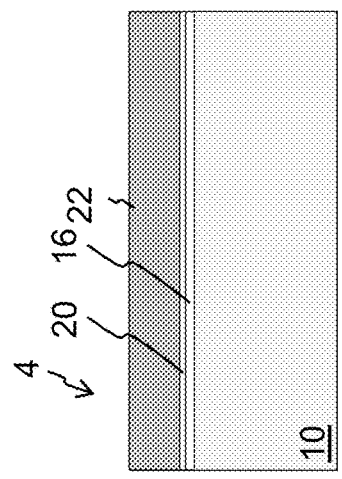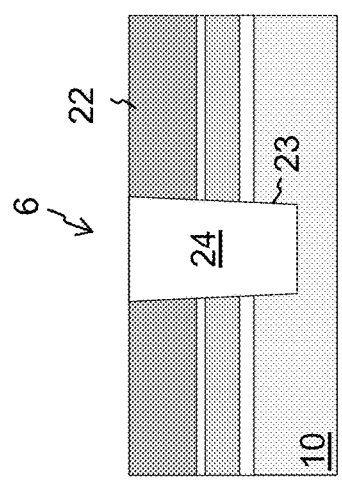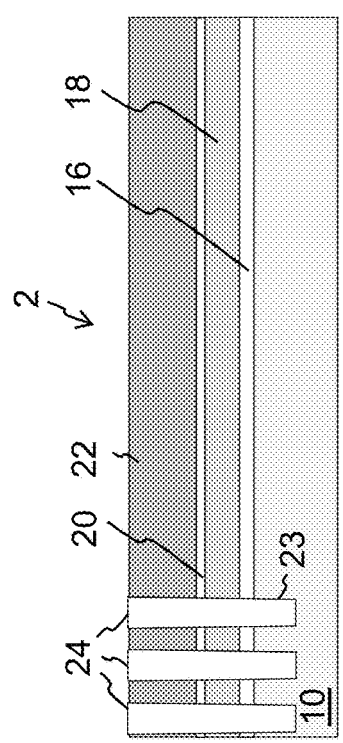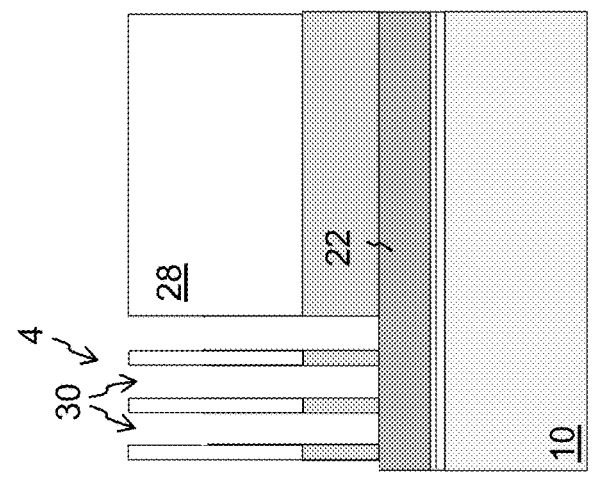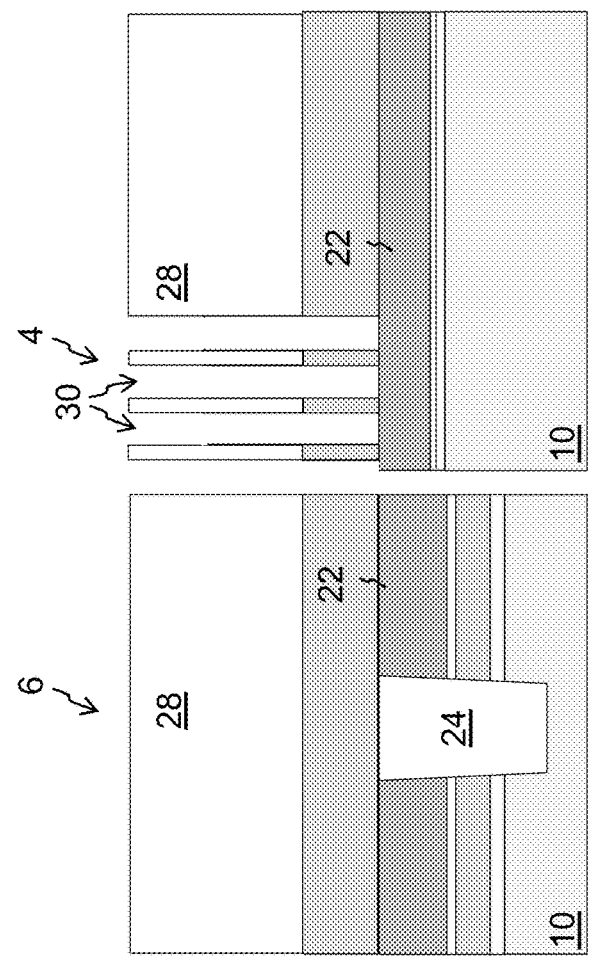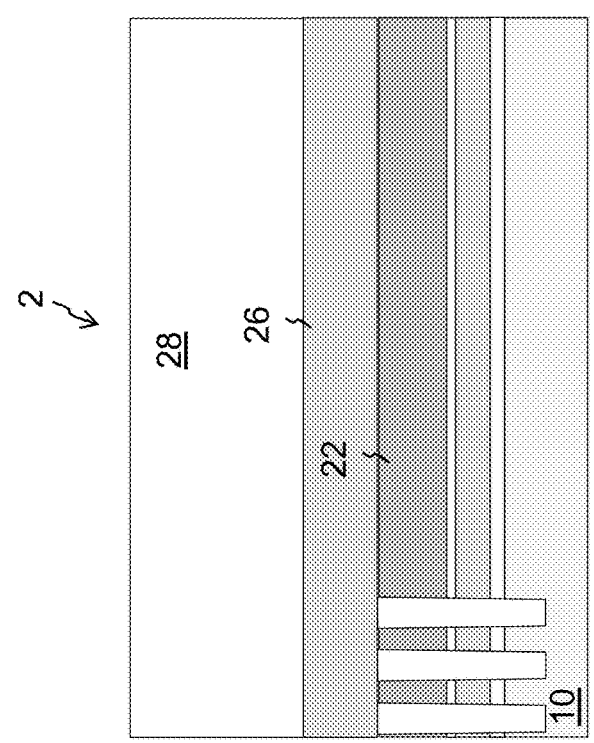

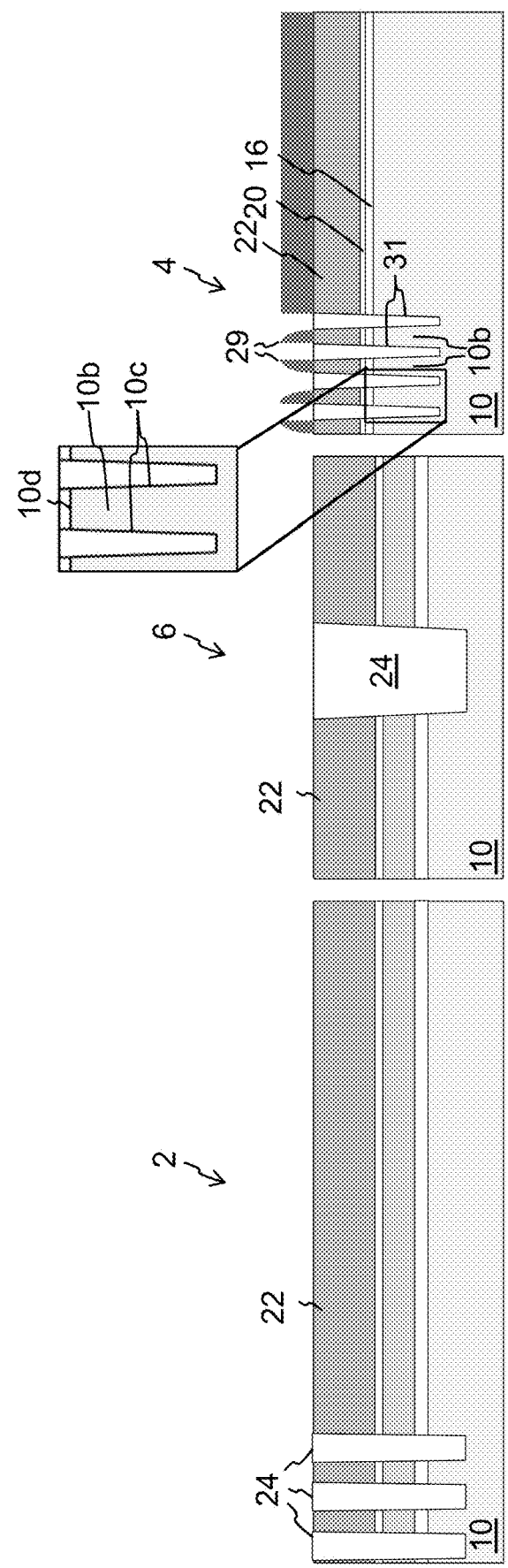

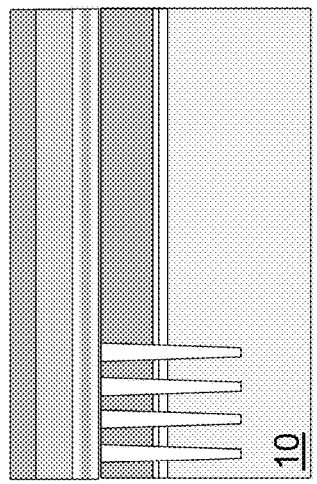
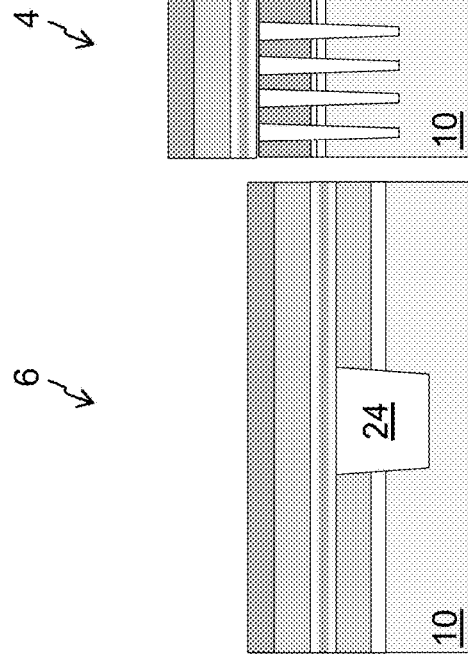
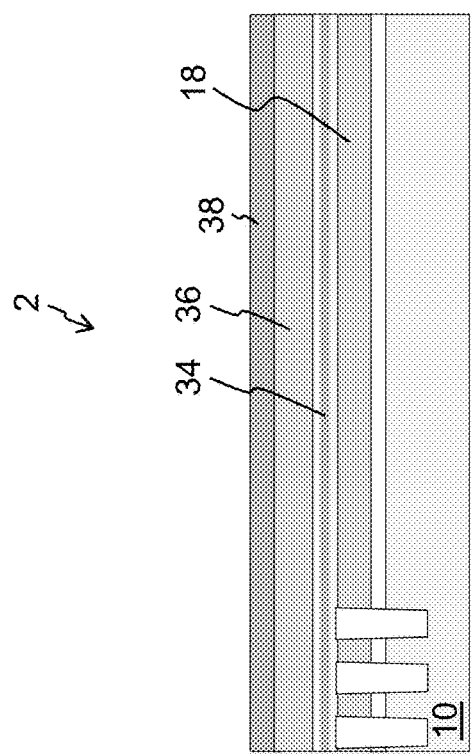
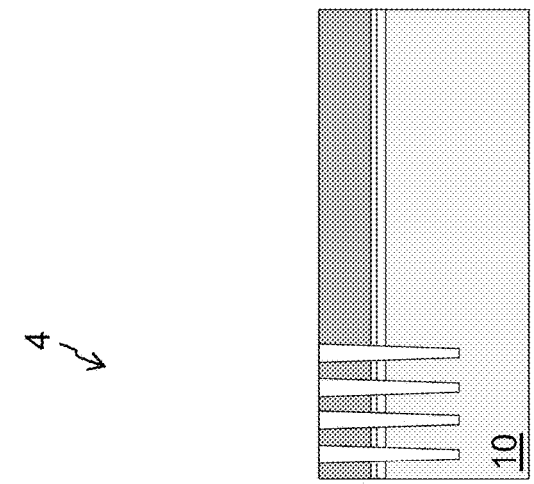
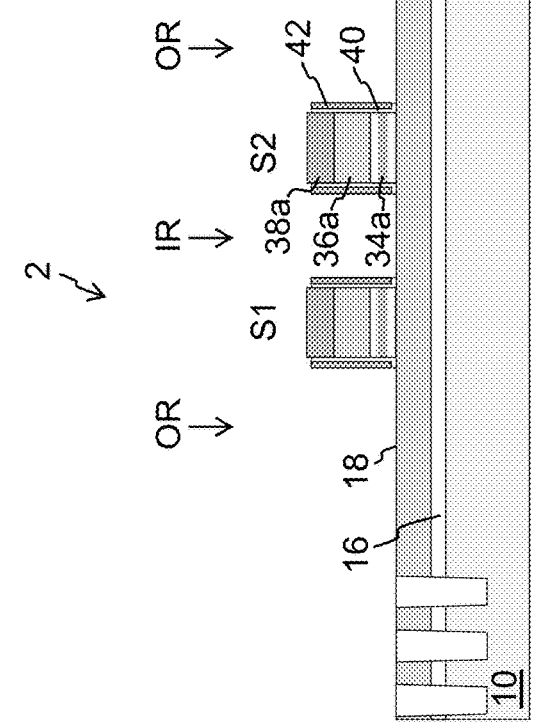

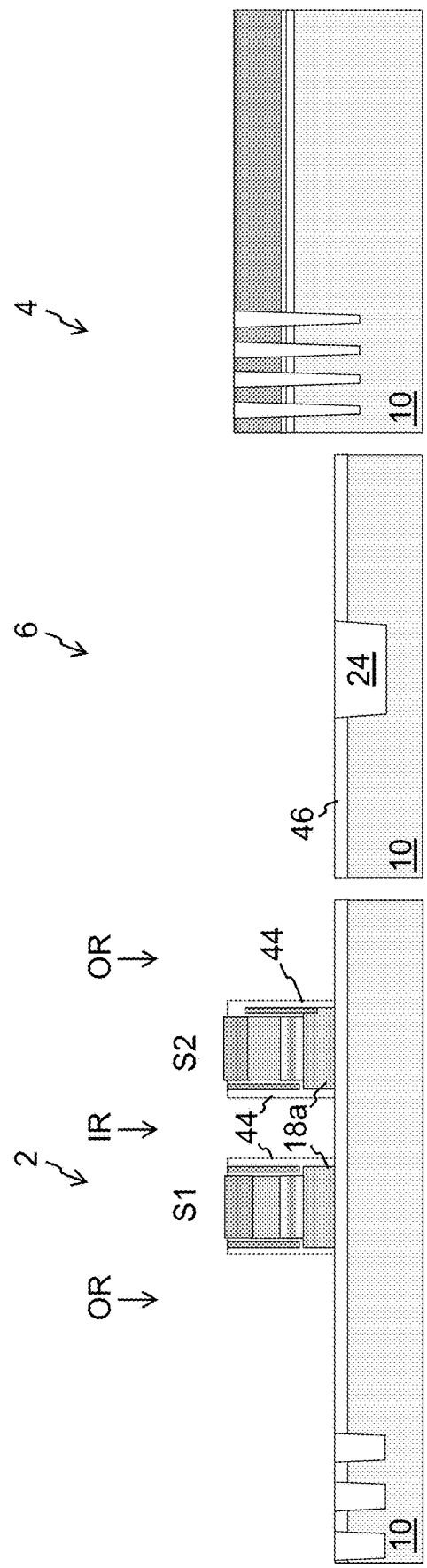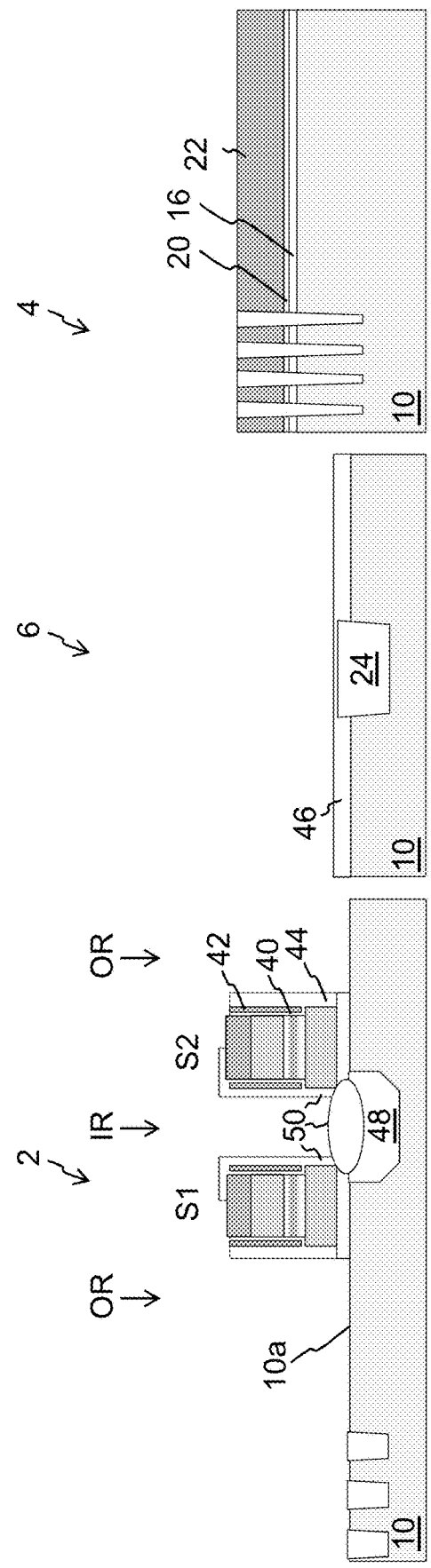

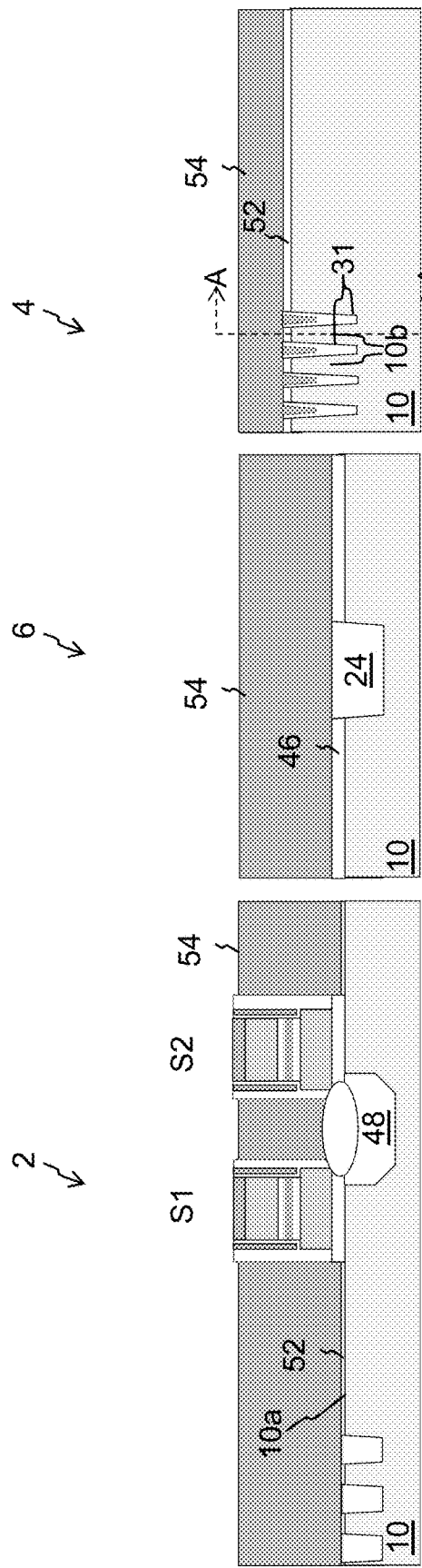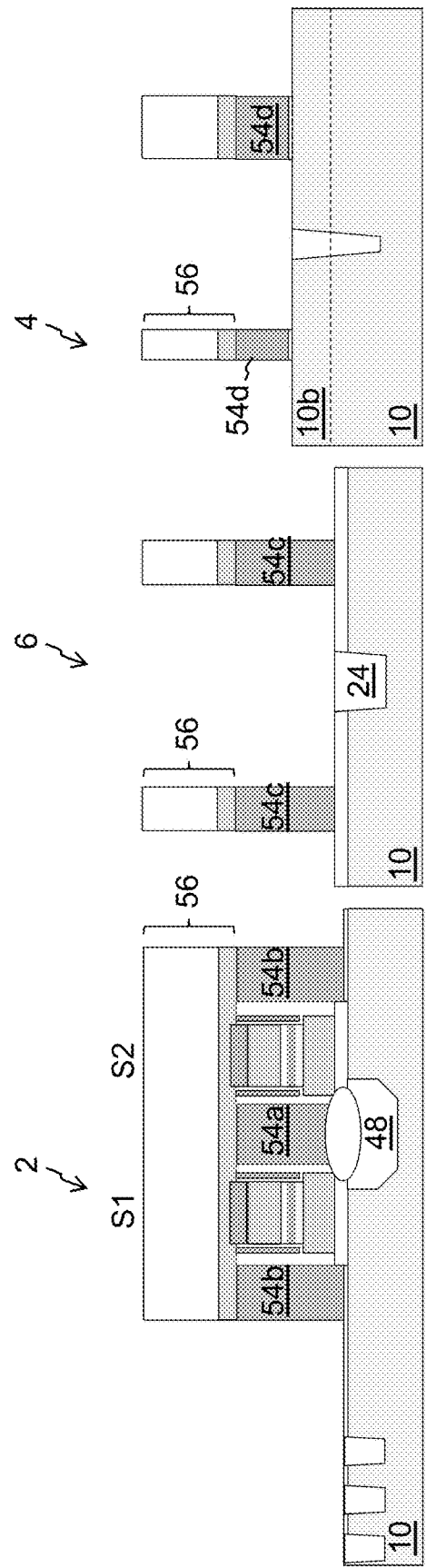

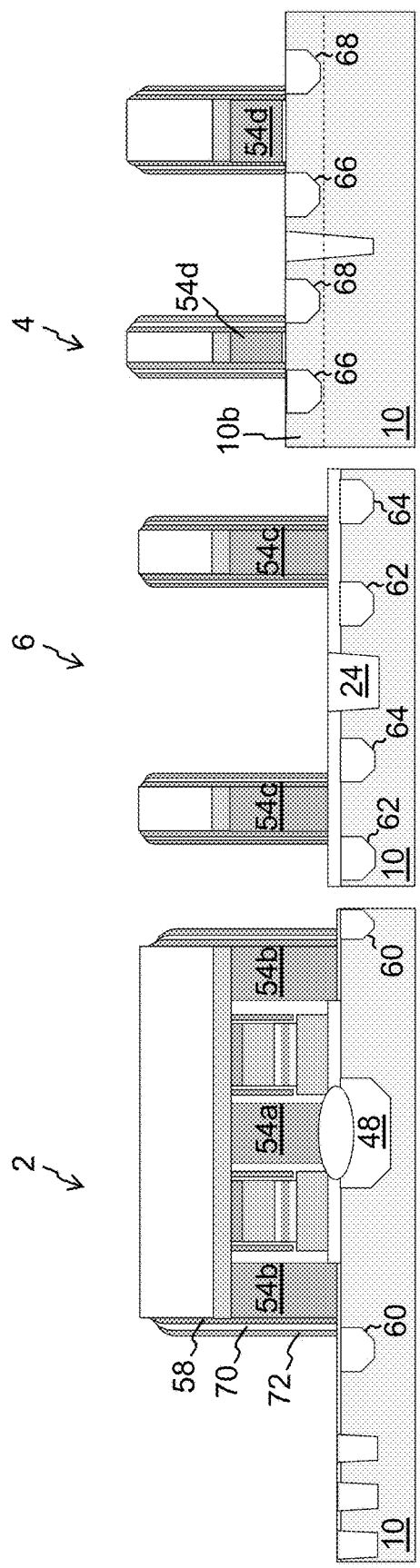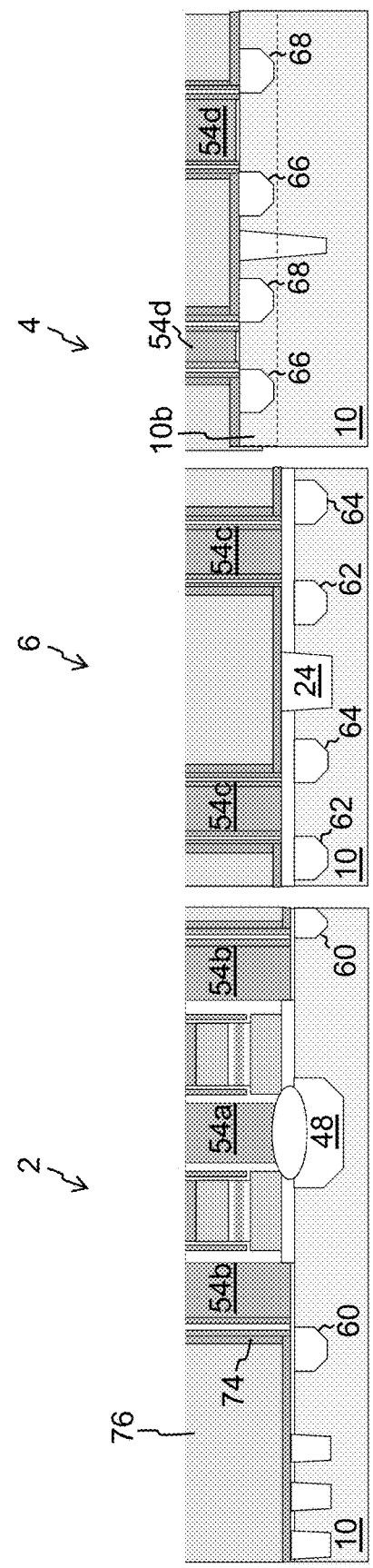

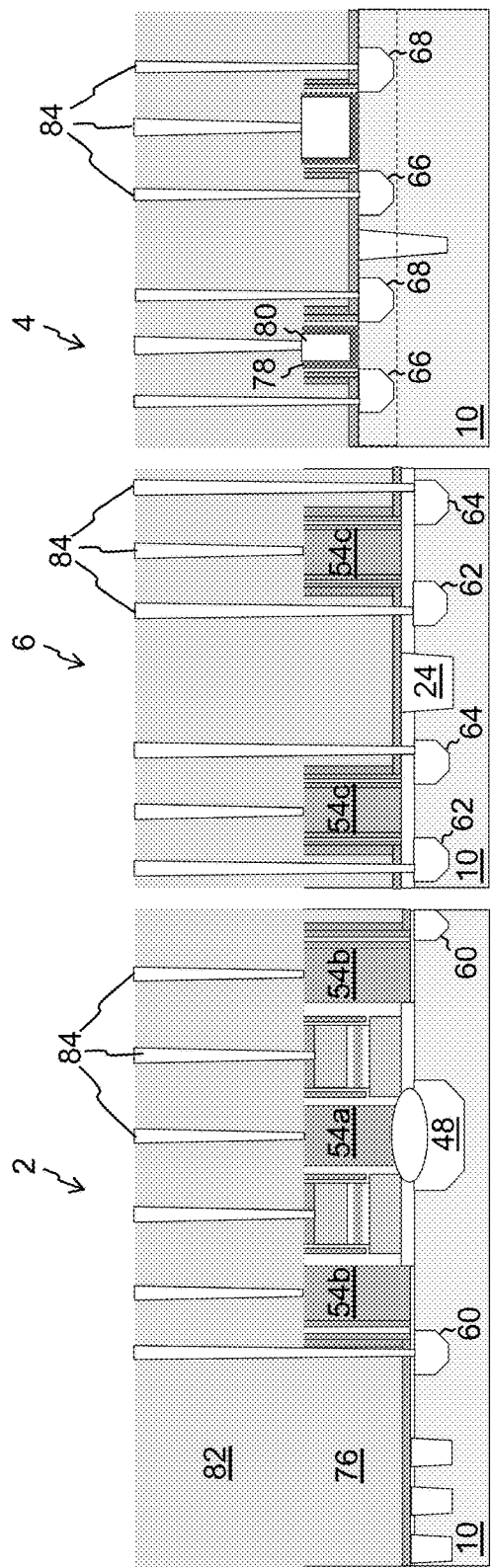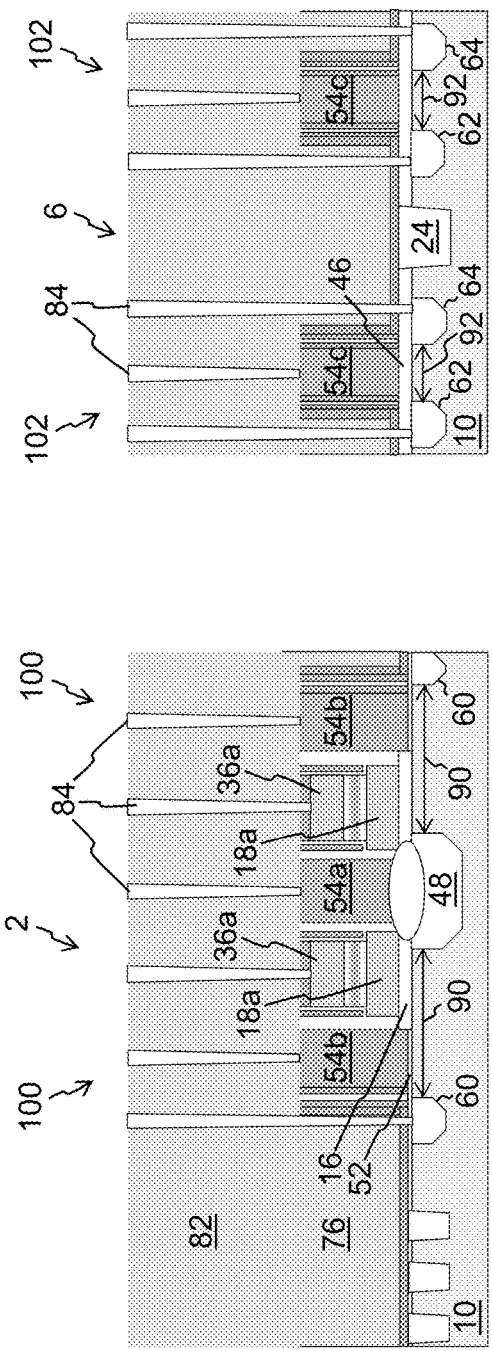

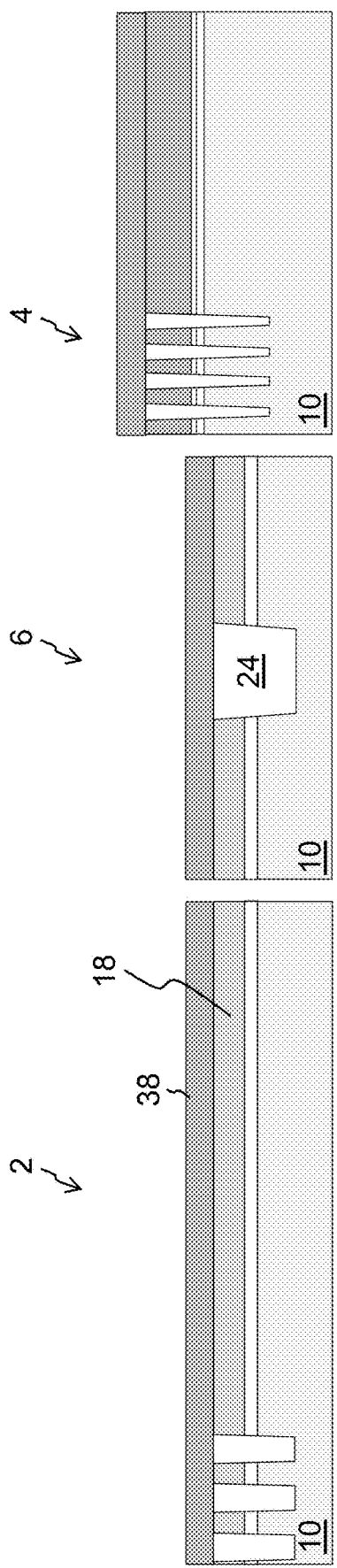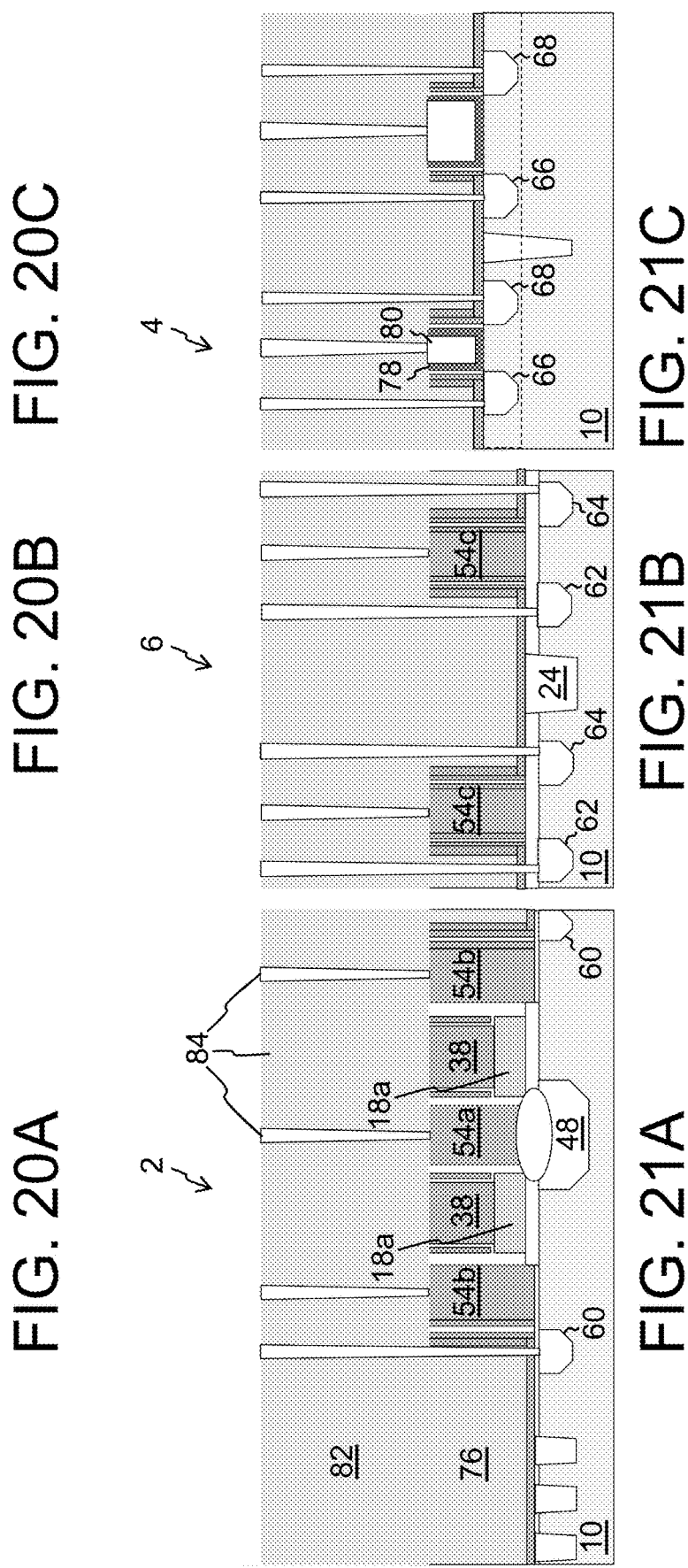

METHOD OF FORMING A DEVICE WITH PLANAR SPLIT GATE NON-VOLATILE MEMORY CELLS, HIGH VOLTAGE DEVICES AND FINFET LOGIC DEVICES

PRIORITY CLAIM

This patent application claims priority to Chinese Patent Application No. 202010993707.2, filed on Sep. 21, 2020, entitled "Method Of Forming A Device With Planar Split Gate Non-volatile Memory Cells, High Voltage Devices And FINFET Logic Device."

TECHNICAL FIELD

The present invention relates to a method of forming a device having non-volatile memory cells, high voltage devices and FINFET logic devices.

BACKGROUND OF THE INVENTION

Split gate non-volatile flash memory cells having a select gate, a floating gate, a control gate and an erase gate are well known in the art. See for example U.S. Pat. Nos. 6,747,310 and 7,868,375, which are incorporated herein by reference. Split gate non-volatile flash memory cells having a select gate, a floating gate and an erase gate are also well known in the art. See for example U.S. Pat. Nos. 7,315,056 and 8,711,636, which are incorporated herein by reference. It is also known to form logic devices (i.e., low voltage and/or high voltage logic devices) on the same silicon chip, and in doing so share some of the processing steps for forming portions of both the memory cells and logic devices (e.g. forming gates for both memory cells and logic devices using the same polysilicon deposition process). However, other processing steps in forming the memory cells can adversely affect previously fabricated logic devices, and vice versa, so it often can be difficult and complex to form both types of devices on the same wafer.

To solve problems with reduced channel widths by shrinking lithography size, FinFET types of structures have been proposed for memory cell structures. In a FinFET type of structure, a fin shaped member of semiconductor material connects the source to the drain regions. The fin shaped member has a top surface and two side surfaces. Current from the source to the drain regions can then flow along the top surface as well as the two side surfaces of the fin shaped member. Thus, the effective width of the channel region is increased, thereby increasing the current flow. However, the effective width of the channel region is increased without sacrificing more semiconductor real estate by "folding" the channel region into two side surfaces, thereby reducing the "footprint" of the channel region. Non-volatile memory cells using such FinFETs have been disclosed. Some examples of prior art FinFET non-volatile memory structures include U.S. Pat. Nos. 7,423,310, 7,410,913, 8,461,640 and 9,985,042, and U.S. patent application Ser. No. 16/724,010, the entire contents of each of which is incorporated herein by reference. What these prior art references do not contemplate is a FinFET type configuration for logic devices formed on the same wafer substrate as both non-volatile memory cells and high voltage transistor devices, both of a non-FinFET type configuration, with improved fabrication techniques.

U.S. Pat. Nos. 9,972,630 and 10,249,631, the entire contents of each of which is incorporated herein by reference, disclose a memory device with FinFET type logic devices and non-FinFET memory cells. However, these patents fail to contemplate the contemporaneous formation of high voltage transistor devices of a non-FinFET type configuration.

BRIEF SUMMARY OF THE INVENTION

The aforementioned problems and needs are addressed by a method of forming a device that includes:
providing a silicon substrate with an upper surface and having first, second and third areas;
recessing the upper surface in the first and second areas of the substrate, but not in the third area of the substrate;
forming a first polysilicon layer over and insulated from the upper surface in the first and second areas;
forming first trenches through the first polysilicon layer and into the silicon substrate in the first and second areas but not in the third area, using at least a first silicon etch;
filling the first trenches with insulation material;
after the filling of the first trenches, forming second trenches into the silicon substrate in the third area using at least a second silicon etch to form an upwardly extending fin of the silicon substrate having a pair of side surfaces extending up and terminating at a top surface;
after the forming of the fin, forming a pair of blocks of material over the first polysilicon layer in the first area;
removing portions of the first polysilicon layer in the first area to form a pair of floating gates of the first polysilicon layer each disposed under one of the pair of blocks of material;
performing a first implantation to form a first source region in the silicon substrate in the first area between the pair of floating gates;
forming a second polysilicon layer over the silicon substrate in the first, second and third areas;
removing portions of the second polysilicon layer to form:
a first polysilicon block of the second polysilicon layer disposed over and insulated from the first source region in the first area,
a second polysilicon block of the second polysilicon layer disposed over and insulated from the silicon substrate and adjacent one of the pair of floating gates in the first area,
a third polysilicon block of the second polysilicon layer disposed over and insulated from the silicon substrate and adjacent another one of the pair of floating gates in the first area,
a fourth polysilicon block of the second polysilicon layer disposed over and insulated from the silicon substrate in the second area, and
a fifth polysilicon block of the second polysilicon layer disposed over and insulated from the pair of side surfaces and the top surface of the silicon fin in the third area;
performing one or more implantations to form:
a first drain region in the first area of the substrate adjacent the second polysilicon block,
a second drain region in the first area of the substrate adjacent the third polysilicon block,
a second source region in the second area of the substrate adjacent the fourth polysilicon block,
a third drain region in the second area of the substrate adjacent the fourth polysilicon block,
a third source region in the fin adjacent the fifth polysilicon block, and
a fourth drain region in the fin adjacent the fifth polysilicon block;

removing the fifth polysilicon block;

forming a layer of high K material along the pair of side surfaces and the top surface of the fin in the third area; and forming a block of metal material on the layer of high K material in the third area so that the block of metal extends along and is insulated from the pair of side surfaces and the top surface of the fin.

Other objects and features of the present invention will become apparent by a review of the specification, claims and appended figures.

BRIEF DESCRIPTION OF THE DRAWINGS

FIGS. 1A-15A are side cross sectional views showing steps in forming non-volatile memory cells in a memory cell area of a semiconductor substrate.

FIGS. 1B-15B are side cross sectional views showing steps in forming high voltage devices in a HV device area of the semiconductor substrate.

FIGS. 1C-15C are side cross sectional views showing steps in forming logic devices in a logic device area of the semiconductor substrate.

FIG. 16 is a side cross sectional view of the memory cells in the memory cell area.

FIG. 17 is a side cross sectional view of the high voltage devices in the HV device area.

FIGS. 20A-21A are side cross sectional views showing steps in forming non-volatile memory cells in a memory cell area of a semiconductor substrate according to an alternate embodiment.

FIGS. 20B-21B are side cross sectional views showing steps in forming high voltage devices in a HV device area of the semiconductor substrate according to the alternate embodiment.

FIGS. 20C-21C are side cross sectional views showing steps in forming logic devices in a logic device area of the semiconductor substrate according to the alternate embodiment.

DETAILED DESCRIPTION OF THE INVENTION

Figure 19:
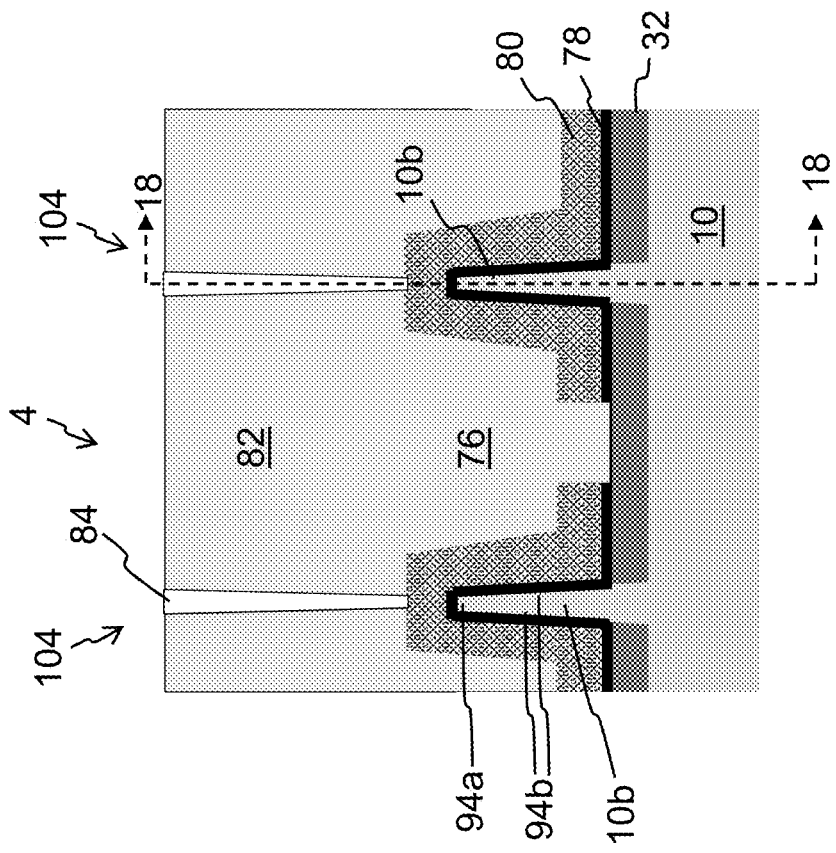
FIGS. 18-19 are side cross sectional views of the logic devices in the logic device area.

Referring to FIGS. 1A-15A, 1B-15B and 1C-15C, there are shown side cross-sectional views of the steps in the process of making pairs of memory cells in a memory cell area 2 (first area) of a semiconductor wafer substrate (also referred to as substrate) 10 (see FIGS. 1A-15A), high voltage transistor devices in a HV device area 6 (second area) of the substrate 10 (see FIGS. 1B-15B), and logic devices in a logic device area 4 (third area) of the substrate 10 (see FIGS. 1C-15C). The process begins by forming a layer of silicon dioxide (also referred to as oxide) 12 on the planar surface 10a of a substrate 10, which substrate 10 may be formed of P type single crystalline silicon. Oxide layer 12 can be formed by deposition or by thermal oxidation. A layer of silicon nitride 14 (also referred to as nitride layer 14) is formed on oxide layer 12. A photolithography masking process is then used to pattern the nitride layer 14 and oxide layer 12 (i.e. selectively remove some portions of the layers but not others). The photolithography masking process includes coating photoresist material on the nitride layer 14, which is followed by exposing and developing the photoresist to remove the photoresist material from the memory cell and HV device areas 2/6 while maintaining the photoresist in the logic device area 4. Nitride and oxide etches are then used to remove the exposed nitride and oxide layers 14/12 from the memory cell and HV device areas 2/6 leaving the upper surface 10a of the substrate 10 exposed in the memory cell and HV device areas 2/6 (the photoresist protects these layers from the etches in the logic device area 4). After the remaining photoresist is removed from the logic device area 4, a silicon oxidation alone, or a silicon oxidation in combination with a silicon etch, is used to recess the exposed upper surface 10a of the substrate 10 in the memory cell and HV device areas 2/6. For example, the silicon oxidation can be a thermal oxidation that consumes the silicon at the substrate's upper surface 10a. Oxide and nitride layers 12/14 protect the logic device area 4 from this oxidation/etch. An oxide etch is then used to remove the oxide created by the thermal oxidation. The resulting structure is shown in FIGS. 1A-1C, where the upper surface 10a of the substrate 10 in the HV/memory cell areas 2/6 is recessed below the surface 10a of the substrate 10 in the logic device area 4 by a recess amount R. A non-limiting example of the amount of recess R can include approximately 20-70 nm.

Nitride and oxide layers 14/12 are removed from the logic device area 4 (e.g. by one or more etches), leaving the surface 10a of the substrate 10 exposed. The upper surface 10a of the substrate 10 at this stage is stepped, where the portions of the upper surface 10a of the substrate 10 in the memory cell and HV device areas 2/6 are recessed (i.e., lower) relative to the portion of the upper surface 10a of the substrate 10 in the logic device area 4 by recess amount R. An oxide (insulation material) layer 16 is then formed on the surface 10a of the substrate 10 in all three areas 2/4/6 (e.g., by deposition or thermal oxide), followed by the formation of a polysilicon (also referred to as poly) layer 18 (first polysilicon layer) by poly deposition on oxide layer 16. A photolithography masking process is used to cover the structure with photoresist and remove the photoresist from the logic device area 4. A polysilicon etch is then used to remove the poly layer 18 from the logic device area 4. The resulting structure is shown in FIGS. 2A-2C (after photoresist removal). This poly layer 18 will eventually be used to form the floating gates of memory cells in memory cell area 2.

An oxide layer 20 is formed on the poly layer 18 in the memory cell and HV device areas 2/6 and on the oxide layer 16 in the logic device area 4, and a nitride layer 22 is formed on the oxide layer 20. A photolithography masking step is used to cover the structure with photoresist and then selectively remove portions of the photoresist to leave select portions of the underlying nitride layer 22 exposed. One or more etches are then performed in those select areas to form trenches 23 that extend through nitride layer 22, oxide layer 20, poly layer 18, oxide layer 16 and into the substrate 10 in memory cell and HV device areas 2/6. After photoresist removal, the structure is covered in a layer of oxide (i.e., shallow trench isolation (STI) oxide) 24, filling the trenches 23 with oxide 24. The structure is then planarized (e.g., by chemical mechanical polish—CMP) to expose the top surface of nitride layer 22. The resulting structure is shown in FIGS. 3A-3C.

A layer of material 26 (e.g., polysilicon) is formed on nitride layer 22. The layer of material 26 is patterned by forming photoresist 28, selectively removing strips of the photoresist 28 in the logic device area 4, and removing the underlying exposed portions of the layer 26 to form trenches 30 in the layer 26 in the logic device area 4 that extend down to and expose the underlying nitride layer 22, as shown in FIGS. 4A-4C. After photoresist removal, spacers 29 are then formed in the trenches 30. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (often with a rounded upper surface). In the present case, the spacers 29 are formed along the sidewalls of trenches 30, and are preferably formed of oxide or nitride. Next, the remaining portions of layer 26 are removed by an etch. Next, the structure is covered with photoresist, which is exposed and developed to remove the photoresist from the logic device area 4. A nitride etch is then used to remove the exposed portions of nitride layer 22 between the spacers 29 in the logic device area, followed by an oxide etch to remove exposed portions of oxide layers 20 and 16 in the logic device area 4 and oxide layer 20 in the memory cell and HV device areas 2/6. A silicon etch is then used to recess the exposed surface of the substrate 10 in the logic device area 4, forming trenches 31 that extend into substrate 10 with fins 10b of the silicon substrate between the trenches 31. Each fin 10b is an upwardly extending member having a pair of side surfaces 10c extending up and terminating at a top surface 10d as explained further below with respect to FIG. 19. The resulting structure is shown in FIGS. 5A-5C (after photoresist removal).

The spacers 29 are removed by an etch. Oxide deposition and CMP are used to fill the spaces between the fins 10b with STI oxide 32. The HV device area can have PMOS and NMOS regions. Photoresist is formed over the structure, and removed from the PMOS regions of HV device area 6. Implantations are then performed into the substrate 10 to form N wells (NW). Etches are then performed to recess the oxide 24, and remove nitride layer 22, in the HV device area 6. After photoresist removal, photoresist is formed over the structure, and removed from the NMOS regions of the HV device area 6 and from the memory cell area 2.

Implantations are then performed into the substrate 10 to form P wells (PW). Etches are then performed to recess the oxide 24, and remove nitride layer 22, in the memory cell area 2. The resulting structure is shown in FIGS. 6A-6C (after photoresist removal).

An oxide etch is used to remove oxide layer 20 from the memory cell and HV device areas 2/6 (and lowers the upper surface of oxide 24 in these areas). A layer of insulation 34, preferably containing three sublayers of oxide, nitride and oxide (e.g., an ONO layer) is formed over the structure. A poly layer 36 is formed on the ONO layer 34 by a second polysilicon deposition. A hard mask layer (e.g., nitride or other appropriate insulation material) 38 is formed on poly layer 36. The resulting structure is shown in FIGS. 7A-7C. Photoresist is formed over the structure, and partially removed to fully expose the logic device area 4, fully expose the HV device area 6, and expose portions of the memory cell area 2, leaving portions of the hard mask layer 38 exposed. A nitride etch is used to remove the exposed portions of hard mask layer 38, exposing portions of poly layer 36. A poly etch is used to remove the exposed portions of poly layer 36, exposing portions of the insulation layer 34. An etch is used to remove the exposed portions of insulation layer 34, exposing portions of the poly layer 18. After photoresist removal, ON (oxide and nitride) spacers 40/42 are formed by oxide deposition, nitride deposition, and then nitride anisotropic etch and oxide anisotropic etch. The resulting structure is shown in FIGS. 8A-8C. As shown in FIG. 8A, pairs of stack structures S1 and S2 are formed in the memory cell area 2, which include blocks of hard mask material 38a remaining from hard mask layer 38, on blocks of polysilicon 36a remaining from poly layer 36, on blocks of insulation 34a remaining from insulation layer 34, with oxide and nitride spacers 40/42 along the sides of stack structures S1 and S2. For each pair of stack structures S1/S2, the area between the stack structures S1 and S2 is referred to herein as the inner region IR, and the areas on the opposite sides of stack structures S1 and S2 are referred to herein as the outer regions OR.

A poly etch is then used to remove the exposed portions of poly layer 18 in the memory cell and HV device areas 2/6 (i.e. all portions except those protected by stack structures S1 and S2). Oxide spacers 44 are then formed on the sides of stack structures S1 and S2 by oxide deposition and anisotropic etch. Stack structures S1 and S2 now further include poly blocks 18a remaining from poly layer 18, at a lower portion thereof. Photoresist is formed over the structure and removed only from the HV device area 6. An optional implantation can be performed into the substrate 10 in the HV device area 6. An oxide etch is then used to remove oxide layer 16 from the HV device area 6. An oxide layer 46 is formed on the exposed substrate surface 10a in the HV device area 6 (e.g., by thermal oxidation or deposition), having a thickness appropriate for the operation of the HV devices to be formed in this area. The resulting structure is shown in FIGS. 9A-9C (after photoresist removal).

The structure is then covered with photoresist, which is selectively removed to expose the inner region IR between pairs of stack structures S1 and S2 in the memory cell area 2. An implantation is then performed to form source regions 48 in the memory cell area 2 in the substrate 10 between each of the pairs of stack structures S1 and S2. An oxide etch is then used to remove the oxide spacers 44 on inner sidewalls of the stack structures S1 and S2 (i.e. those sidewalls facing each other in the inner region IR). A layer of oxide (tunnel oxide) 50 is formed on the inner sidewalls of the stack structures S1 and S2 and on the substrate surface 10a between the stack structures S1 and S2 (e.g. by thermal oxidation and/or oxide deposition), having a thickness suitable for electron tunneling. Thermal oxidation and the high dopant concentration of the source regions 48 can cause oxide layer 50 to be thicker on the substrate surface 10a. The structure is covered by photoresist, which is removed from the outer regions OR in the memory cell area 2. An implantation is performed in the substrate 10 in the outer regions OR (referred to as the word line voltage implant). An oxide etch is used to remove oxide layer 16 from the outer regions OR in the memory cell area 2. The resulting structure is shown in FIGS. 10A-10C (after photoresist removal).

Photoresist is formed on the structure, and removed from the logic device area 4. An etch is used to remove nitride layer 22 from the logic device area 4. An implantation is performed to create a well in the substrate 10 in the logic device area 4. An oxide etch is used to remove oxide layers 20 and 16 from the logic device 4, and to recess the oxide 32 in the trenches 31 that surround the fins 10b. After photoresist removal, a dielectric (insulation) layer 52 is formed on the exposed surface 10a of the substrate in the memory cell and logic device areas 2/4, and along the sides of the fins 10b in the logic device area 4. Dielectric layer 52 also becomes part of the oxide layer 46 in the HV device area 6. Dielectric layer 52 can an oxide, an oxynitride, or other suitable insulating material. A layer of polysilicon 54 (second polysilicon layer) is then deposited on the structure including around the sides of fins 10b in the logic device area 4. CMP and etch back processes are used to reduce the thickness of the polysilicon layer 54 (i.e., so that the upper surface of poly layer 54 is even with, or below, the tops of the stack structures S1/S2 in the memory cell area 2). The resulting structure is shown in FIGS. 11A-11C.

A hard mask layer 56 is formed on the structure, which can be a single layer of material or multiple layers of material (two layers are shown in the figures). The hard mask layer 56 is patterned using one or more photolithography processes, leaving portions of the hard mask layer 56 exposed. The exposed portions of the hard mask layer 56 are removed by one or more etches, leaving portions of the poly layer 54 exposed. The exposed portions of the poly layer 54 are removed by one or more etches, where those portions of poly layer 54 underneath and protected by the remaining portions of the hard mask 56 are protected from the one or more etches and remain. The resulting structure is shown in FIGS. 12A-12C, where FIG. 12C is a cross sectional view of the fin 10b orthogonal to the views of FIGS. 1C-11C, along the line A-A in FIG. 11C. The patterning of the hard mask and poly layer could be performed in two stages. For example, a first hard mask etch could be performed in the memory cell and HV device areas 2/6, and in a partial area in the logic device area 4, followed by separate second hard mark etch for the partial area in the logic device area 4 only. After photoresist removal, a separate poly etch is then performed. The resulting structure has first blocks of poly 54a remaining from poly layer 54 each disposed over one of the source regions 48, second and third blocks of poly 54b remaining from poly layer 54 each disposed in one of the outer regions OR adjacent one of the stack structures S1/S2, fourth blocks of poly 54c remaining from poly layer 54 each disposed in the HV device area 6, and fifth blocks of poly 54d remaining from poly layer 54 each disposed in the logic device area 4. Each of the fifth blocks of poly 54d wrap around the fin 10b.

Insulation spacers (e.g. nitride) 58 are formed on the sides of the structures by deposition and anisotropic etch. A series of masking steps and implantations are performed to form drain regions 60 in the substrate 10 adjacent the poly blocks 54b in the memory cell area 2, source and drain regions 62 and 64 in the substrate 10 adjacent the poly blocks 54c in the HV device area 6, and source and drain regions 66 and 68 in the substrate 10 adjacent the poly blocks 54d. The formation of source and drain regions 66 and 68 in the logic device area 4 can include removing portions of the fins 10b adjacent poly blocks 54d, and replacing them with epitaxially grown material, where source and drain regions 66 and 68 are epitaxially grown material portions of the fins 10b. Optionally, drain regions 60 in the memory cell area 2, and/or source and drain regions 62/64 in the HV device area 6, can also be replaced with epitaxially grown material in a similar manner. Additional oxide spacers 70 and nitride spacers 72 can be formed along nitride spacers 58. The resulting structure is shown in FIGS. 13A-13C.

An etch stop layer of material 74 is formed over the structure. A thick layer of insulation material (ILD) 76 is formed over the structure. Chemical mechanical polishes and etches are then performed to lower the ILD layer 76, remove hard mask layer 56, and expose poly blocks 54a, 54b, 54c and 54d (e.g., stop CMP after poly blocks 54a-54d are exposed), as shown in FIGS. 14A-14C. Etches are used to remove poly blocks 54d (exposing dielectric layer 52) and to remove exposed dielectric layer 52 from the logic device area 4. A layer of high K material 78 (i.e. having a dielectric constant K greater than that of silicon dioxide, such as HfO2, ZrO2, TiO2, Ta2O5, or other adequate materials) is formed on the structure. A layer of metal material is formed over the structure. A CMP is used to remove the metal material and high K material layer except for blocks of metal 80 disposed over, and insulated from, the fin 10b by the layer of high K material 78. ILD insulation layer 82 is formed over the structure, and contact holes are formed in the ILD and other insulation layers to expose the various source and drain regions, poly blocks and metal blocks. The contact holes are then filled with a contact material, such as metal, to form electrical contacts 84. The final structure is shown in FIGS. 15A-15C.

FIG. 16 is a cross sectional view showing a pair of non-volatile memory cells 100 formed in the memory cell area 2. Each pair of non-volatile memory cells 100 includes a (first) source region 48 and two (first and second) drain regions 60 that define planar channel regions 90 in the substrate 10 there between. For each non-volatile memory cell 100, a floating gate, formed by poly block 18a is disposed over and controls a first portion of the channel region 90, and a word line (select) gate formed by poly block 54b is disposed over and controls a second portion of the channel region 90. A control gate, formed from polysilicon block 36a, is disposed over the floating gate formed by poly block 18a, and an erase gate formed by poly block 54a is disposed over the source region 48. The non-volatile memory cells 100 are formed in pairs end to end, which each memory cell pair sharing a common drain region 60, and adjacent pairs of non-volatile memory cells 100 sharing a common erase gate formed by poly block 54a and source region 48. The dielectric layer 52 under the word line gates formed by poly block 54b is preferably thinner than the oxide layer 16 under the floating gates formed by poly block 18a, for better word line gate performance.

FIG. 17 includes a cross sectional view of HV (high voltage) devices 102 formed in the HV device area 6. Each HV device 102 includes a (second) source region 62 and a (third) drain region 64 that define a planar channel region 92 in the substrate 10 there between. The HV gate formed by poly block 54c is disposed over and controls the conductivity of the planar channel region 92. The HV gate formed by poly block 54c is insulated from the substrate by oxide layer 46, which can have a different thickness than oxide layer 16 (for the floating gates formed by poly block 18a) and dielectric layer 52 (for the word lines gates formed by poly block 54b) because it is formed separately, for improved performance of the HV devices 102.

Figure 18:
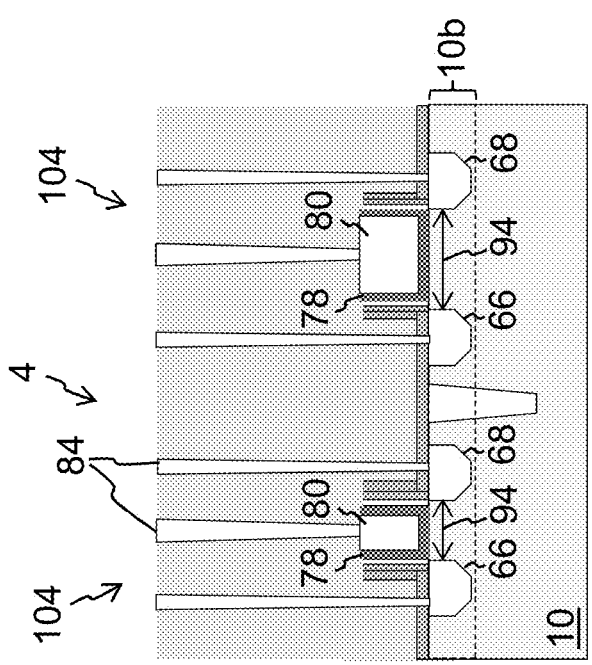

FIGS. 18 and 19 are cross sectional views of logic devices 104 formed in the logic device area 4. Each logic device 104 includes a (third) source region 66 and a (fourth) drain region 68 that define a channel region 94 in the fin 10b there between. As best shown in FIG. 19, channel region 94 includes a top surface portion 94a extending along the top of the fin 10b, and side surface portions 94b extending along the sides of the fin 10b. The logic gate 80 wraps around the fin 10b (i.e., the logic gate formed from blocks of metal 80 is disposed over the top surface portion of the channel region 94, particularly over top surface portion 94a, and laterally adjacent to the side surface portions 94b, for controlling the conductivity of the channel region 94).

While only two non-volatile memory cells 100, two HV devices 102 and two logic devices 104 are shown in the figures, one skilled in the art would appreciate that many devices of each type are simultaneously formed in their respective areas.

The above described memory device method and resulting structure provide many advantages, including the advantages of high operational performance and ease of manufacturing of planar non-volatile memory cells 100 (i.e.

non-volatile memory cells 100 that are formed on a planar region of the substrate 10 and have a planar channel region 90) and planar HV devices 102 (i.e., devices that are formed on a planar region of the substrate 10 and have a planar channel region 92) with the advantages of advanced combinations of embedded logic and memory devices where the logic devices 104 are condensed, non-planar logic devices (i.e., logic devices that are formed on, and surrounding, fins 10b and have channel regions 94 which are non-planar). The FinFET transistor architecture of the logic devices 104 provides enhanced channel control with a tri-gate configuration and enables further scaling of the transistor dimensions.

Another advantage is that the upper surface 10a of substrate 10 is recessed in the memory cell and HV device areas 2/6 relative to the logic device area 4. Specifically, the planar upper surface 10a of the substrate 10 which constitute the channel regions in the memory cell and HV device areas 2/6 have a height that is recessed below the tops of the fins 10b in the logic device area 4 by a recess amount R as shown in FIGS. 1A-1C, which accommodates the higher gate stack thickness and topology of the memory cell and HV devices 100/102 relative to the logic devices 104. Additionally, common processing in the logic device area 4 and the memory cell and HV device areas 2/6 is facilitated. For example, having fins 10b in the logic device area 4 rising above the height of the substrate surface in the memory cell area simplifies the common formation steps of blocks of poly layer 54, hard mask layer 56, and spacers 58/70/72. Similarly, common implantation steps can be used to form the memory cell drain regions 60, HV device source/drain regions 62/64 and logic device source/drain regions 66/68. Further, the erase gates formed by poly block 54a, word line gates formed by poly block 54b, HV gates formed by poly block 54c and dummy poly blocks 54d are all formed using the same polysilicon deposition processing. Still another advantage is using poly blocks 54d of poly layer 54 as dummy blocks, which are removed and replaced with high K material and metal gates 80. This means a single polysilicon layer is used to form the erase gates formed by poly block 54a and word line gates formed by poly block 54b in the memory cell area 2, the high voltage gates formed by poly block 54c in the HV device area 6, and the dummy poly blocks 54d in the logic area 4. A majority of the process fabrication for the memory cells and HV devices (including the formation of all the poly blocks for the gates of the memory cells and HV devices) is performed before the formation of the logic gates, which reduces processing impacts on the CMOS baseline. The STI insulation for the memory cell and HV device areas 2/6 are formed before the fins 10b are formed in the logic device area 4, which means the depths of STI extending into the substrate can vary between the memory cell and HV device areas 2/6 and the logic device area (i.e., the trenches 23 can extend deeper into the substrate 10 than do the trenches 31, and vice versa).

FIGS. 20A-20C and 21A-21C illustrate an alternate embodiment, which begins with the structure of FIGS. 6A-6C. In this alternate embodiment, the steps described above with respect to FIGS. 7A-7C are performed, except the formations of insulation layer 34 and poly layer 36 are omitted, so that hard mask layer 38 is formed directly on the poly layer 18, as shown in FIGS. 20A-20C. The remaining processing steps are performed as described above except for any steps that were directed to insulation layer 34 and poly layer 36, resulting in the final structure shown in FIGS. 21A-21C. The only significant difference in the final structure in this first alternate embodiment is that there are no control gates (blocks of material from poly layer 36) over the floating gates formed by poly block 18a in the memory cell area 2. Instead, each memory cell only includes only three gates (floating gate formed by poly block 18a, word line gate formed by poly block 54b, and erase gate formed by poly block 54a). In this embodiment, the blocks of material over the floating gates are blocks of nitride layer 38. The omission of the control gate would allow the height of the memory cells to be further reduced.

It is to be understood that the present invention is not limited to the embodiment(s) described above and illustrated herein. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method steps need be performed in the exact order illustrated or claimed, but rather in any order (unless there is an explicitly recited limitation on any order) that allows the proper formation of the memory cells and logic devices of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a device, comprising:
   providing a silicon substrate with an upper surface and having first, second and third areas;
   recessing the upper surface in the first and second areas of the substrate, but not in the third area of the substrate;
   forming a first polysilicon layer over and insulated from the upper surface in the first and second areas;
   forming first trenches through the first polysilicon layer and into the silicon substrate in the first and second areas but not in the third area, using at least a first silicon etch;
   filling the first trenches with insulation material; after the filling of the first trenches, forming second trenches into the silicon substrate in the third area using at least a second silicon etch to form an upwardly extending fin of the silicon substrate having a pair of side surfaces extending up and terminating at a top surface;

after the forming of the fin, forming a pair of blocks of material over the first polysilicon layer in the first area;
removing portions of the first polysilicon layer in the first area to form a pair of floating gates of the first polysilicon layer each disposed under one of the pair of blocks of material;
performing a first implantation to form a first source region in the silicon substrate in the first area between the pair of floating gates;
forming a second polysilicon layer over the silicon substrate in the first, second and third areas;
removing portions of the second polysilicon layer to form:
  a first polysilicon block of the second polysilicon layer disposed over and insulated from the first source region in the first area,
  a second polysilicon block of the second polysilicon layer disposed over and insulated from the silicon substrate and adjacent one of the pair of floating gates in the first area,
  a third polysilicon block of the second polysilicon layer disposed over and insulated from the silicon substrate and adjacent another one of the pair of floating gates in the first area,
  a fourth polysilicon block of the second polysilicon layer disposed over and insulated from the silicon substrate in the second area, and
  a fifth polysilicon block of the second polysilicon layer disposed over and insulated from the pair of side surfaces and the top surface of the silicon fin in the third area;
performing one or more implantations to form:
  a first drain region in the first area of the substrate adjacent the second polysilicon block,
  a second drain region in the first area of the substrate adjacent the third polysilicon block,
  a second source region in the second area of the substrate adjacent the fourth polysilicon block,
  a third drain region in the second area of the substrate adjacent the fourth polysilicon block,
  a third source region in the fin adjacent the fifth polysilicon block, and
  a fourth drain region in the fin adjacent the fifth polysilicon block;
removing the fifth polysilicon block;

forming a layer of high K material along the pair of side surfaces and the top surface of the fin in the third area; and
forming a block of metal material on the layer of high K material in the third area so that the block of metal extends along and is insulated from the pair of side surfaces and the top surface of the fin.

2. The method of claim 1, wherein the pair of blocks of material are formed of polysilicon and are insulated from the pair of floating gates.

3. The method of claim 2, wherein the pair of blocks of material are insulated from the pair of floating gates by an oxide-nitride-oxide layer.

4. The method of claim 1, wherein the pair of blocks of material are formed of an insulation material.

5. The method of claim 1, the forming of the second trenches comprises:
  forming a layer of material over the upper surface in the third area;
  forming third trenches in the layer of material;
  forming spacers of material in the third trenches;
  removing the layer of material; and
  performing the second silicon etch in portions of the silicon substrate between the spacers of material.

6. The method of claim 1, wherein the forming of the third source region and the fourth drain region comprises:
  before removing the fifth polysilicon block, epitaxially growing material on the fin adjacent to the fifth polysilicon block, wherein the third source region and the fourth drain regions are formed in the epitaxially grown material.

7. The method of claim 1, wherein the second and third polysilicon blocks are insulated from the upper surface of the substrate by insulation material having a thickness that is less than a thickness of insulation material insulating the floating gates from the upper surface.

8. The method of claim 1, wherein the fourth polysilicon block is insulated from the upper surface of the substrate by insulation material having a thickness that is different than a thickness of insulation material insulating the floating gates from the upper surface.

9. The method of claim 1, wherein the first trenches extend deeper into the substrate than do the second trenches.

10. The method of claim 1, wherein the second trenches extend deeper into the substrate than do the first trenches.

* * * * *